(12) United States Patent
Baur et al.

(10) Patent No.: US 6,436,248 B1
(45) Date of Patent: Aug. 20, 2002

(54) THIN FILM DISK WITH BARRIER LAYER

(75) Inventors: Heinz Baur, Mainz; Ralf Bluethner, Radebeul; Hans Buchberger, Kronberg; Klaus Goedicke; Michael Junghaehnel, both of Dresden; Karl-Heinz Lehnert, Mainz; Manfred Mueller, Essenheim; Hans-Herrman Schneider, Heidesheim; Torsten Winkler, Radeberg, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,590

(22) Filed: Nov. 5, 1999

(30) Foreign Application Priority Data

Nov. 5, 1998 (DE) .......................... 198 51 062

(51) Int. Cl.⁷ ............................................. C23C 14/34
(52) U.S. Cl. ........................ 204/192.16; 204/192.12; 204/192.15; 204/192.2
(58) Field of Search ................... 204/192.2, 192.15, 204/192.12, 192.16

(56) References Cited

U.S. PATENT DOCUMENTS

| | | | | |
|---|---|---|---|---|
| 4,816,127 A | * | 3/1989 | Eltoukhy | 204/192.15 |
| 4,869,797 A | * | 9/1989 | Nagao et al. | 204/192.16 |
| 5,300,205 A | | 4/1994 | Fritsche | 204/192.12 |
| 5,456,978 A | * | 10/1995 | Lal et al. | 428/332 |
| 5,512,150 A | * | 4/1996 | Bourez et al. | 204/192.2 |
| 5,626,920 A | * | 5/1997 | Weir et al. | 427/530 |
| 5,700,593 A | * | 12/1997 | Okumura ete al. | 428/694 TS |
| 5,725,913 A | * | 3/1998 | Wong et al. | 427/530 |
| 6,019,876 A | * | 2/2000 | Goedicke et al. | 204/192.2 |
| 6,063,245 A | * | 5/2000 | Frach et al. | 204/192.15 |

FOREIGN PATENT DOCUMENTS

| | | | | |
|---|---|---|---|---|
| DE | 19651615 | * | 7/1997 | C23C/14/35 |
| JP | PUPA 4-129029 A1 | | 4/1992 | |
| JP | PUPA 5-36054 A1 | | 2/1993 | |
| JP | 08/227525 | | 9/1996 | G11B/5/85 |
| JP | 8-227525 | * | 9/1996 | C23C/14/34 |
| JP | PUPA 10-74619 A1 | | 3/1998 | |
| WO | WO98/32128 | | 7/1998 | G11B/5/66 |

OTHER PUBLICATIONS

R. Chia, et al., "Overview of Accelerated Corrosion Tests on Thin Film Magnetic Media", The Minerals, Metals, & Materials Society, 1998, pp. 311–319.

\* cited by examiner

Primary Examiner—Rodney G. McDonald
(74) Attorney, Agent, or Firm—G. Marlin Knight

(57) ABSTRACT

A method of coating of thin film coated magnetic disks and thin film magnetic disks made thereby is described. In accordance with the invention, a barrier layer is deposited on the substrate before the underlayer film(s) to increase the corrosion resistance of metallic substrate magnetic disks and, in the case of nonmetallic substrates, to reduce the diffusion of water to the substrate and of freely moveable ions from the substrate. Preferably the barrier layer is deposited by medium frequency pulsed sputtering at a frequency of 10 to 200 kHz and a pulse length to pulse pause ratio from 5:1 to 1:10. Aluminum or chromium are the preferred materials for the barrier layer. Additional improvements may be achieved where the sputtering process gas contains a proportion of oxygen and/or nitrogen.

8 Claims, 1 Drawing Sheet

THIN FILM DISK WITH BARRIER LAYER

FIELD OF THE INVENTION

The invention relates to thin film magnetic disks of high storage density for use in hard magnetic disks and more particularly to magnetron sputtering of thin films on magnetic disks.

BACKGROUND OF THE INVENTION

Methods of producing thin film magnetic disks systems where a large number of substrates are coated at one time, or in single disk sputtering system, are already known. The substrates for the production of thin film magnetic disks presently consist of glass or of highly polished aluminum disks with a nickel-phosphorous coating. In the future, various alternative materials such as aluminum borocarbide might be used.

Whatever the substrate material, a number of thin films are applied by physical and/or chemical sputtering of the films. There are one or more nonmagnetic underlayer films, which are often chromium based, followed by one or more magnetic layers, which typically consist of composite alloys of cobalt, chromium and other metals, and an overcoat, which is typically carbon based. DC magnetron sputtering is the most commonly used coating method in the production of thin film magnetic disks.

For high-quality thin film magnetic disks, a storage density in excess of 3 Gbit/in2 is presently required. The resulting fly height of the magnetic heads is below 40 nm. A reduction in noise and in gaps on the storage surface and effective adaptation to the heads are prerequisites for the realization of this storage density.

Methods of achieving the low flying heads by improving the topography of the surface of the finished thin film magnetic disk and reducing the thickness of the films, especially the magnetic coat and the top coat, is already known. By using new alloys for the magnetic storage layer and specially adapted underlying structures, thin film magnetic disks with coercive field strengths of $\geq 2500$ Oe and remanent magnetization layer thickness (Mrt) of $\geq 0.5$ can be produced with good reproducibility.

New problems, not previously encountered, have arisen chiefly due to demands for increasing storage density and reducing the thickness of the films.

A decisive shortcoming is the fact that increased corrosion occurs with the use of aluminum substrates. This corrosion gives rise to blooming and warping on the surface of the magnetic disk, which results in areas which can no longer be written on or read. There is a danger that these may come into contact with the heads, as the flying head is around the same height as the bloom. Two factors have an effect on corrosion. On one hand, errors in polishing the substrates and residues from wet processes are triggers for corrosion. On the other hand, the atomized films are only tight and non-porous to a limited extent. Among other things, the reduction in film thickness from 30 nm to 10 nm has the effect of worsening corrosion behavior. The top film can only perform the function of the mechanical protection of the magnetic film against contact with the heads and, in conjunction with the lubricant, safeguards the sliding capability of the heads. (The problem of corrosion is described in detail by Chia, Wang, Tang and Lee in "Overview of Accelerated Corrosion Tests on Thin Film Magnetic Media" in The Minerals, Metals & Materials Society, 1998, p. 311–319.) Although the substrates are polished to a mirror finish, the topography of the finished magnetic disks is less than ideal. Microscopic cracks and pinholes can be detected. These defects on the surface of the substrates stand in the way of optimum cleaning during the washing process. This decreases the evenness of the sputtering of the films and results in less effective covering of the edges. It is known that corrosion can be reduced by increasing the thickness of the underlayer film and applying a negative DC voltage to the substrate during the sputtering of the underlayer film.

Neither of these measures solves the problem. They only reduce the number of corrosion points revealed in acid tests with HCl or $HNO_3$. The usefulness of the measures is not unlimited. The increase in thickness of the underlayer film is in conflict with the requirements as regards magnetism. The application of a negative DC voltage to the substrate can only be used in the case of conductive substrates.

SUMMARY OF THE INVENTION

An object of the invention is improving the production of thin film magnetic disks to such an extent that, in the case of metallic substrates, the corrosion resistance of magnetic disks is significantly increased and, in the case of nonmetallic substrates, the diffusion of water to the substrate and of freely moveable ions from the substrate is drastically reduced. The method is intended for use with all substrate materials—both conductive and insulating. It is intended that the method can be implemented for industrial use in the usual plants. A further object of the invention is to create a thin film magnetic disk with increased corrosion resistance.

The invention places a barrier layer between the substrate and the series of typical nonmagnetic and magnetic films in such a way that the magnetic values such as coercive field strength and remanent magnetization layer thickness are not influenced. This reduces the corrosion to such an extent that practically no gaps caused by corrosion can be detected on the magnetic disks using known testing methods. This represents an improvement by one to two orders of magnitude. Surprisingly, the effect is achieved at a barrier layer thickness as low as just a few nanometers (nm), e.g., less than 10 nm. which is thinner than the typical underlayer. In accordance with the method, aluminum or chromium are the preferred materials for application as barrier layers.

Very good properties are achieved where the sputtering process gas contains a proportion of oxygen and/or nitrogen. Depositing a chromium film for the barrier layer is very advantageous, as the crystal formation in the subsequent steps is not disturbed.

It is of particular advantage that the effect of the barrier layer can be adapted to the relevant substrate material by means of the choice of material to be sputtered, the film thickness and the selection of the frequency and pulse ratio for the sputtering process. A frequency of 50 kHz has been shown to be particularly suitable. This frequency evidently brings about a favorable sputtering rate to the plasma excitation ratio, to form very tight, defect-free films with a high yield of sputtered excited particles. The freedom from defects here relates to films without pinholes or a columnar structure.

The method in accordance with the invention can be implemented for all magnetic disk coating systems. This suitability for integration into production plants is a great advantage of the method.

DESCRIPTION OF THE PREFERRED EMBODIMENTS

Figure 1:
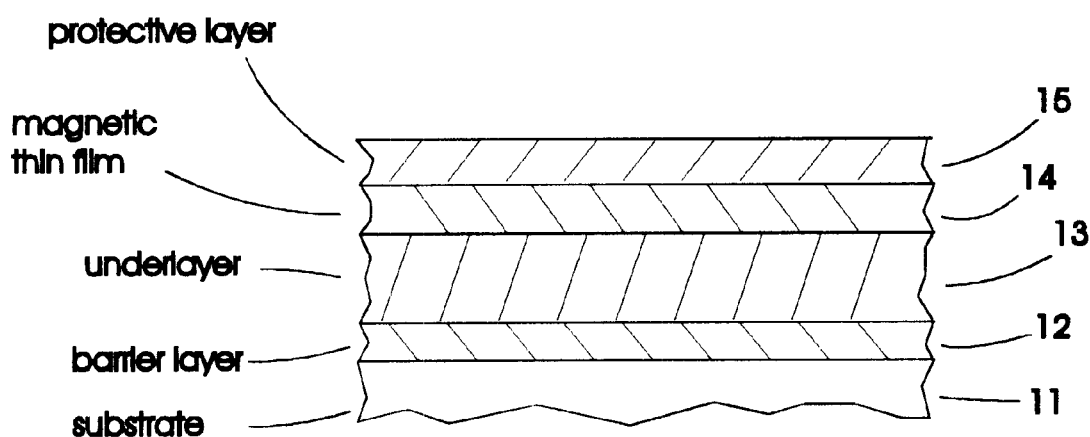
FIG. 1 illustrates the layer structure of a thin film disk including the barrier layer of the invention.

The invention will be illustrated in more detail using an example of embodiment.

A known single disk system is used to sputter a series of magnetic films and a barrier layer on an aluminum substrate which has a nickel-phosphorous coating. As proof of the effectiveness of the method in accordance with the invention, a standard process is drawn upon. For the coated thin film magnetic disks, the magnetic properties and the properties of the barrier layer are determined. These values must be within the specified tolerances. A sample of the coated magnetic disks is subjected to an acid test using $HNO_3$ in order to evaluate the corrosion resistance.

After the reference samples have been prepared, the thin film magnetic disks are produced in accordance with the invention as illustrated in FIG. 1. To do this, in addition to the process steps used hitherto: heating, sputtering of the underlayer film 13, sputtering of the magnetic film(s) 14 and sputtering of the protective coating 15, a further process step of applying the barrier layer 12 is introduced after the heating stage. Here, the substrates are heated to 220° C., and a barrier layer is deposited before sputtering of the underlayer film.

The process time for the sputtering of the barrier layer is 4 seconds at a pressure of 0.8 Pa. Oxygen with a partial pressure of 0.1 Pa is mixed in with the inert process gas. An aluminum target with a standard magnetron arrangement is used. Energy is pulsed into the plasma. The preferred pulse frequency is 50 kHz, and the pulse length to pulse gap ratio is adjusted to 1:1. The resulting plasma power on time is 10 microseconds and the gap is also 10 microseconds. The primary power, i.e. the power fed into the pulsing device, is 150 W averaged over time. The ranges for the medium-frequency sputtering are frequencies between 10 and 200 kHz with a pulse length to pulse gap ratio in the region of 5:1 to 1:10.

The method in accordance with the invention has also shown that, with a pulse length of 14 microseconds and cycle duration of 20 microseconds the positive effect starts to decrease once more, i.e. the corrosion gaps start to increase sharply again.

The table shows measurement values for magnetic properties and measured corrosion values. The introduction of a very tight, pinhole-free barrier layer sputtered by means of medium frequency pulsed magnetron sputtering improves corrosion behaviour by one to two orders of magnitude. The application of a negative DC voltage bias from −50 V to −500 V, preferably −200 V, to the substrate during sputtering of the barrier layer further improves corrosion resistance. The bias advantageously be pulsed with, for example, a frequency of 50 kHz. The magnetic values of coercive field strength and remanent magnetization layer thickness do not change when the method is carried out using the stated parameters (see table below):

|  | Barrier | Pulse ratio for barrier | Substrate bias | Corrosion points per disk | Hc [Oe] average values | Mrt average values |
|---|---|---|---|---|---|---|
| Standard | no |  | no | 85–105 | 2595 | 0.59 |
| Variant 1 | yes | 1:1 | no | 1–4 | 2575 | 0.61 |
| Variant 2 | yes | 1:1 | yes | 0–2 | 2610 | 0.6 |

The greatest effect is achieved by the introduction of the barrier layer in accordance with the invention in itself. Variant 1 shows that the number of corrosion points which are discovered in the course of a $HNO_3$ test is very small compared with the standard process. Variant 2 shows that the sputtering of the barrier layer with a negative DC voltage bias applied to the substrate produces a further improvement.

We claim:

1. Method for coating thin film magnetic disks in a magnetron sputtering chamber comprising the steps of:
   depositing a barrier layer on a substrate by medium-frequency sputtering at a frequency between 10 and 200 kHz and with a pulse length to pulse gap ratio between the range of 5:1 to 1:10;
   depositing at least one underlayer after depositing the barrier layer; and
   depositing at least one magnetic film after depositing the underlayer.

2. The method in accordance with claim 1, wherein the barrier layer is chromium.

3. The method in accordance with claim 1, wherein the barrier layer is aluminum.

4. The method in accordance with claim 1 the step of depositing a barrier layer further comprising the step of adjusting a gas pressure in the chamber to 0.1 to 1.5 Pa.

5. The method in accordance with claim 1 the step of depositing a barrier layer further comprising the step of applying a DC voltage of −50 V to −500 V to the substrate during the sputtering of the barrier layer.

6. The method in accordance with claim 1, wherein the frequency is approximately 50 kHz.

7. The method in accordance with claim 1, wherein the barrier layer is deposited to a thickness of less than 10 nm.

8. The method in accordance with claim 7, wherein the underlayer is deposited to a thickness of greater than 10 nm.

* * * * *